United States Patent
Annunziata et al.

(10) Patent No.: US 10,008,536 B2
(45) Date of Patent: Jun. 26, 2018

(54) ENCAPSULATION OF MAGNETIC TUNNEL JUNCTION STRUCTURES IN ORGANIC PHOTOPATTERNABLE DIELECTRIC MATERIAL

(71) Applicant: International Business Machines Corporation, Armonk, NY (US)

(72) Inventors: Anthony J. Annunziata, Stamford, CT (US); Chandrasekharan Kothandaraman, New York, NY (US); Qinghuang Lin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/403,830

(22) Filed: Jan. 11, 2017

(65) Prior Publication Data
US 2017/0162782 A1    Jun. 8, 2017

Related U.S. Application Data

(63) Continuation of application No. 14/961,243, filed on Dec. 7, 2015, now Pat. No. 9,647,200.

(51) Int. Cl.
*H01L 27/22* (2006.01)
*H01L 43/02* (2006.01)
(Continued)

(52) U.S. Cl.
CPC .......... *H01L 27/222* (2013.01); *G11C 11/161* (2013.01); *H01L 43/02* (2013.01);
(Continued)

(58) Field of Classification Search
CPC ....... H01L 27/222; H01L 43/02; H01L 43/08; H01L 43/10; H01L 43/12;
(Continued)

(56) References Cited

U.S. PATENT DOCUMENTS

| 5,296,400 A | 3/1994 | Park et al. |
| 6,127,721 A | 10/2000 | Narayan et al. |

(Continued)

FOREIGN PATENT DOCUMENTS

| CN | 104505433 A | 4/2015 |
| JP | H08264522 A | 10/1996 |

(Continued)

OTHER PUBLICATIONS

English translation for Chinese Application No. CN104505433A.
(Continued)

*Primary Examiner* — Scott B Geyer
(74) *Attorney, Agent, or Firm* — Vazken Alexanian; Ryan, Mason & Lewis, LLP

(57) ABSTRACT

Methods and devices are provided to construct magnetic devices, such as magnetic random access memory devices, having MTJ (magnetic tunnel junction) structures encapsulated in organic photopatternable dielectric material. For example, a method includes forming an MTJ structure on a semiconductor substrate, encapsulating the MTJ structure in a layer of organic photopatternable dielectric material, patterning the layer of organic photopatternable dielectric material to form a contact opening in the layer of organic photopatternable dielectric material to the MTJ structure, and filling the contact opening with metallic material.

14 Claims, 4 Drawing Sheets

(51) Int. Cl.
*H01L 43/12* (2006.01)
*H01L 43/08* (2006.01)
*G11C 11/16* (2006.01)
*H01L 43/10* (2006.01)

(52) U.S. Cl.
CPC .............. *H01L 43/08* (2013.01); *H01L 43/10* (2013.01); *H01L 43/12* (2013.01)

(58) Field of Classification Search
CPC ... H01L 23/28–23/3192; H01L 21/56–21/568; G11C 11/161
See application file for complete search history.

(56) References Cited

U.S. PATENT DOCUMENTS

| | | | |
|---|---|---|---|
| 6,713,802 | B1 | 3/2004 | Lee |
| 6,783,995 | B2 | 8/2004 | Hineman et al. |
| 6,784,091 | B1 | 8/2004 | Nuetzel et al. |
| 6,924,485 | B2 | 8/2005 | Kanzaki |
| 9,129,846 | B2 | 9/2015 | Song et al. |
| 9,647,200 | B1 * | 5/2017 | Annunziata ............. H01L 43/02 |
| 2004/0222412 | A1 | 11/2004 | Bai et al. |
| 2007/0080381 | A1 | 4/2007 | Chien et al. |
| 2007/0205521 | A1 | 9/2007 | Robinson |
| 2009/0091037 | A1 | 4/2009 | Assefa et al. |
| 2014/0061827 | A1 | 3/2014 | Huang et al. |
| 2015/0325622 | A1 * | 11/2015 | Zhang ..................... H01L 43/12 257/421 |
| 2016/0133828 | A1 * | 5/2016 | Lu .......................... H01L 43/02 257/421 |
| 2016/0133830 | A1 * | 5/2016 | Tan ......................... H01L 43/12 257/421 |

FOREIGN PATENT DOCUMENTS

| | | |
|---|---|---|
| JP | 3710529 B2 | 10/2005 |
| KR | 100542721 B1 | 1/2006 |
| KR | 100845089 B1 | 7/2008 |

OTHER PUBLICATIONS

English translation for Korean Application No. KR100845089B1.
English translation for Korean Application No. KR100542721B1.
English translation for Japanese Application No. JP3710529B2.
English translation for Japanese Application No. JP08264522A.
Espacenet English translation for Chinese Application No. CN104505433A.
Espacenet English translation for Korean Application No. KR100845089B1.
Espacenet English translation for Korean Application No. KR100542721B1.
Espacenet English translation for Japanese Application No. JP3710529B2.
Espacenet English translation for Japanese Application No. JP08264522A.

* cited by examiner

ENCAPSULATION OF MAGNETIC TUNNEL JUNCTION STRUCTURES IN ORGANIC PHOTOPATTERNABLE DIELECTRIC MATERIAL

TECHNICAL FIELD

This disclosure generally relates to semiconductor fabrication techniques and, in particular, magnetic random access memory devices, and methods for fabricating magnetic random access memory devices.

BACKGROUND

Spin-transfer torque magnetic random-access memory (STT-MRAM) is a type of solid state, non-volatile memory that uses tunneling magnetoresistance (TMR) to store information. An MRAM device comprise an electrically connected array of magnetoresistive memory elements, referred to as magnetic tunnel junctions (MTJs). As is known in the art, a basic structure of a magnetic tunnel junction includes two thin ferromagnetic layers separated by a thin insulating layer through which electrons can tunnel. The spin-transfer torque (STT) phenomenon is realized in an MTJ structure, wherein one ferromagnetic layer (referred to as "magnetic free layer") has a non-fixed magnetization, and the other ferromagnetic layer (referred to as a "magnetic pinned layer", or "reference layer") has a "fixed" magnetization.

An MTJ stores information by switching the magnetization state of the magnetic free layer. When the magnetization direction of the magnetic free layer is parallel to the magnetization direction of the reference layer, the MTJ is in a "low resistance" state. Conversely, when the magnetization direction of the free layer is antiparallel to the magnetization direction of the reference layer, the MTJ is in a "high resistance" state. The TMR of an MTJ determines the difference in resistance between the high and low resistance states. In general, the TMR of an MTJ is defined as $(R_{AP}-R_P)/R_P$ where $R_P$ and $R_{AP}$ are the resistance of the MTJ for parallel and anti-parallel alignment of the ferromagnetic layers, respectively. A relatively high difference between the high and low resistance states facilitates read operations in the MRAM. The difference in resistance of these two states of the MTJ is used to indicate a logical '1' or '0', thereby storing a bit of information. The tunneling current is typically higher when the magnetic moments of the two ferromagnetic layers are parallel and lower when the magnetic moments of the two ferromagnetic layers are anti-parallel.

When fabricating MRAM devices, the MTJ structures are typically encapsulated in a layer of insulating/dielectric material, and conductive contacts are formed in the encapsulating layer of insulating/dielectric material to make electrical connections to and between the MTJ structures in an MRAM array. Conventional processes and materials that are used for encapsulating the MTJ structures and patterning the encapsulating material to form contact openings to the MTJ structures, can cause a signification degradation in the electrical and/or magnetic performance of the MTJ structures.

SUMMARY

Embodiments of the invention generally include methods and devices for fabricating magnetic components (such as MRAM devices) having MTJ structures encapsulated in organic photopatternable dielectric material. For example, in one embodiment of the invention, a method includes forming a MTJ (magnetic tunnel junction) structure on a semiconductor substrate, encapsulating the MTJ structure in a layer of organic photopatternable dielectric material, patterning the layer of organic photopatternable dielectric material to form a contact opening in the layer of organic photopatternable dielectric material to the MTJ structure, and filling the contact opening with metallic material.

Another embodiment includes a semiconductor device. The semiconductor device includes a MTJ (magnetic tunnel junction) structure formed on a semiconductor substrate. The MTJ structure is encapsulated in a layer of organic photopatternable dielectric material. A contact opening is formed in the layer of organic photopatternable dielectric material to the MTJ structure, wherein the contact opening is filled with metallic material. In one embodiment, the MTJ structure is formed as part of a BEOL (back end of line) structure on the semiconductor substrate, and wherein the layer of organic photopatternable dielectric material is an ILD (inter-level dielectric) layer of the BEOL structure. In one embodiment, the organic photopatternable dielectric material comprises a polymer material such as a photopatternable polyimide or an epoxy, for example.

Other embodiments will be described in the following detailed description of embodiments, which is to be read in conjunction with the accompanying figures.

DETAILED DESCRIPTION OF EMBODIMENTS

Embodiments of the invention will now be discussed in further detail with regard to methods and devices for fabricating magnetic devices (e.g., MRAM devices) having MTJ structures encapsulated in organic photopatternable dielectric material. As explained in further detail below, methods according to embodiments of the invention are provided to encapsulate MTJ structures in a layer of organic photopatternable dielectric material that is directly patterned to form contact openings to the MTJ structures, which are filled with metallic material to form contacts to the MTJ structures. The exemplary methods discussed herein in accordance with embodiments of the invention provide significant advantages in terms of enhanced performance, higher yield, and reduced fabrication process complexity for the fabrication of magnetic components (e.g., MRAM devices) which comprise MTJ structures, as compared to conventional techniques.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
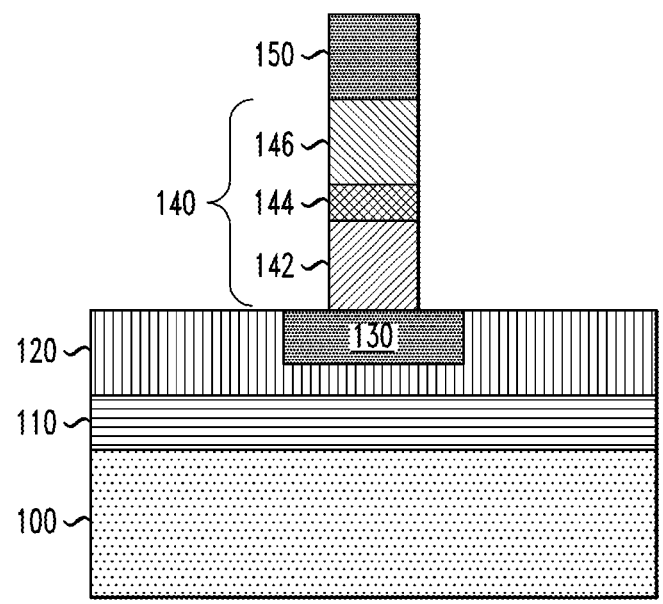
FIG. 1 is cross-sectional schematic view of a semiconductor device at an intermediate stage of fabrication in which an MTJ structure is formed on a substrate, according to an embodiment of the invention.

Methods for fabricating semiconductor devices (e.g., MRAM devices) comprising MTJ structures will now be discussed in further detail with initial reference to FIG. 1, which shows a cross-sectional schematic view of a semiconductor device at an intermediate stage of fabrication in which a MTJ structure is formed on a substrate, according to an embodiment of the invention. In particular, FIG. 1 shows a semiconductor substrate 100, an FEOL (front-end-of-line) structure 110, an insulating layer 120, a first (lower) electrode 130, a magnetic tunnel junction (MTJ) 140 and a second (upper) electrode 150. In the example embodiment of FIG. 1, the MTJ 140 comprises a magnetic pinned layer 142 (or reference layer), a barrier tunneling layer 144, and a magnetic free layer 146 disposed between the first and second electrodes 130 and 150. The various components 130, 140 and 150 form an MTJ structure.

In one embodiment, the substrate 100 comprises a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. The thickness of the base substrate 100 will vary depending on the application. In another embodiment, the substrate 100 comprises a SOI (silicon on insulator) substrate, which comprises an insulating layer (e.g., oxide layer) disposed between a base semiconductor substrate (e.g., silicon substrate) and an active semiconductor layer (e.g., active silicon layer) in which active circuit components (e.g., field effect transistors) are formed.

The FEOL structure 110 comprises various semiconductor devices and components that are formed in or on the active surface of the semiconductor substrate 100 to provide integrated circuitry for a target application. For example, the FEOL structure 110 comprises FET devices (such as FinFET devices, planar MOSFET device, etc.), bipolar transistors, diodes, capacitors, inductors, resistors, isolation devices, etc., which are formed in or on the active surface of the semiconductor substrate 100. A BEOL (back-end-of-line) structure is formed on the FEOL structure 110 to connect the various components of the FEOL structure 100. The various components 120, 130, 140 and 150 shown in FIG. 1 are part of the BEOL structure. As is known in the art, a BEOL structure comprises multiple levels of vertical and horizontal wiring embedded in layers of dielectric material, wherein conductive vias provide vertical wiring between layers, and interconnects provide horizontal wiring in a given layer. A BEOL fabrication process involves successive depositing and patterning of multiple layers of dielectric and metallic material to form a network of electrical connections among the FEOL devices and to provide I/O connections to external components.

In the example embodiment of FIG. 1, the insulating layer 120 comprises one or more insulating layers that are formed as part of the initial BEOL processing, including a PMD (pre-metal dielectric) layer, and one or more inter-level dielectric (ILD) layers. The PMD and ILD layers of the insulating layer 120 may be formed of any suitable material such as, e.g., silicon oxide, silicon nitride, hydrogenated silicon carbon oxide, silicon based low-k dielectrics, porous dielectrics, or organic dielectrics including porous organic dielectrics. In addition, the PMD and ILD layers of the insulating layer 120 may be formed using known deposition techniques, such as, for example, ALD, CVD, PECVD, spin on deposition, or PVD, followed by a standard planarization process (e.g., CMP) to planarize the upper surface of the semiconductor structure between deposition of different layers. The horizontal and vertical metal wiring of the BEOL structure in FIG. 1 is formed by patterning the dielectric layer by known lithography, reactive ion etching, cleaning, metal deposition and planarization processes. The main wiring metal is usually copper or copper alloys. This process of forming metal wiring within a dielectric insulator is repeated to form multiple layers of a BEOL structure.

In the example embodiment of FIG. 1, the PMD layer is formed directly on active devices of the FEOL structure 110, and a plurality of conductive via contacts (no specifically shown) would be formed through the PMD layer in contact with terminals (e.g., source/drain regions) of the active circuitry of the FEOL structure 110. A first ILD layer of the insulating layer 120 is formed over the PMD layer and patterned to form a plurality of trenches/vias which are filled with metallic material to form a first metallization (M1) pattern. This process is repeated for additional ILD and metallization levels of the BEOL structure. In the embodiment of FIG. 1, the first electrode 130 can be considered part of a metallization layer of the BEOL structure. The first electrode 130 provides a contact and pedestal on which to build the MTJ 140. The first electrode 130 can be formed of any suitable conductive material(s) such as tantalum, tantalum nitride, ruthenium, titanium, etc., using known deposition techniques.

The MTJ 140 and second electrode 150 are formed at some level in the BEOL structure by sequentially depositing layers of materials forming the respective components 142, 144, 146, and 150, followed by patterning the deposited layers to form the second electrode 150 and the MTJ 140 shown in FIG. 1. For example, the magnetic pinned layer 142 may be formed by depositing a layer of magnetic material which includes cobalt (Co) or iron (Fe), boron (B), or any combination thereof. In particular, the magnetic pinned layer 142 can be formed of CoFeB or CoFe. The tunnel barrier layer 144 is formed of a non-magnetic, insulating material such as magnesium oxide (MgO), aluminum oxide (AlO), or titanium oxide (TiO) or any other suitable materials. The free magnetic layer 146 can be formed of a magnetic material such as iron (Fe) or a magnetic material including at least one of cobalt (Co) or iron (Fe) or nickel (Ni), or any combination thereof. The second electrode 150 can be formed of any suitable conductive material(s) such as tantalum, tantalum nitride, ruthenium, titanium, etc.

The stack structure shown in FIG. 1 is formed by patterning the conductive material layer (e.g., TaN) to form the second electrode 150, which serves as a hard mask to etch the layers of materials forming the MTJ 140. The conductive material layer (forming the second electrode 150) can be etched selective to the underlying magnetic material using a reactive ion etch (RIE) process such as a halogen-based chemical etch process (e.g., including chlorine-containing gas and/or fluorine-containing gas chemistry). The hard mask (e.g., second electrode 150) is then used as an etch mask to etch the underlying magnetic and tunnel barrier layers, wherein the pattern of the hard mask is transferred to the underling magnetic free layer 146, the tunnel barrier layer 144, and the pinned (reference) layer 142 using a standard MRAM stack etch process (e.g., an RIE or an ion beam etch (IBE) process).

It is to be understood that the MTJ 140 shown in FIG. 1 is merely one embodiment of a MTJ structure which can implemented to provide a single magnetic tunnel junction stack framework. The term "MTJ structure" as used herein is meant to broadly refer to any stack structure which includes, at the very least, an MTJ which comprises two magnetic layers (e.g., ferromagnetic and/or ferrimagnetic layers) and an insulating layer deposited between the two magnetic layers through which electrons can tunnel. In the example embodiment of FIG. 1, the MTJ structure comprises the MTJ 140 and electrodes 130 and 150. The MTJ 140 in FIG. 1 may include other magnetic, conductive and/or insulting layers, depending on the given application. For example, additional stacked layers may include two or more magnetic layers and two or more tunnel barrier layers, and other layers that are commonly implemented to construct other types of magnetic tunnel junction structures, e.g., double magnetic tunnel junction structures. The thickness of the constituent layers of the MTJ 140 and materials used to form the MTJ 140 will vary depending on the application.

Moreover, while FIG. 1 shows only one MTJ structures (130/140/150) for ease of illustration, the semiconductor device is actually formed with an array of similar MTJ structures in the BEOL, to provide an MRAM array, for example. The control circuitry to control the MRAM array is formed as part of the active circuitry of the FEOL 110, with lower levels of metallization of the BEOL structure providing electrical connections between the active circuitry and the first (lower) electrodes 130 of the MTJ structures.

Figure 2:
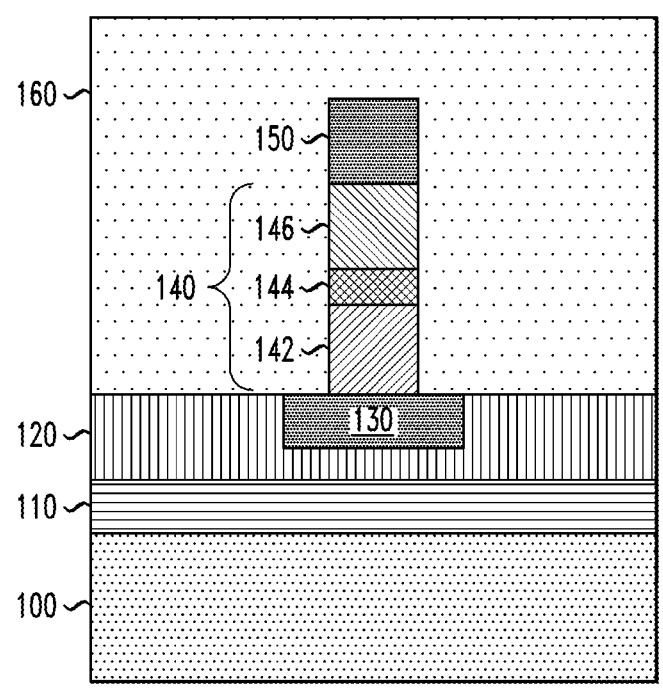
FIG. 2 is cross-sectional schematic view of the semiconductor device of FIG. 1 after depositing a layer of organic photopatternable dielectric material to encapsulate the MTJ structure, according to an embodiment of the invention.

A next step in the fabrication process comprises encapsulating the MTJ structure (130/140/150) in a layer of organic photopatternable dielectric material. For example, FIG. 2 is cross-sectional schematic view of the semiconductor device of FIG. 1 after depositing a layer of organic photopatternable dielectric material 160 to encapsulate the MTJ structure (130/140/150), according to an embodiment of the invention. In one embodiment of the invention, the organic photopatternable dielectric layer 160 is formed of any insulating/dielectric material that can be directly exposed and developed (via photolithography techniques) and which is suitable to serve as an ILD layer in the BEOL structure of the semiconductor device (e.g., have relatively low dielectric constant, impervious to water, maintain structural integrity during subsequent BEOL and packaging processes, etc.).

For example, in one embodiment, the organic photopatternable dielectric layer 160 comprises a spin-on organic photopatternable dielectric material, which is self-planarizing. The use of a spin-on dielectric material allows the organic photopatternable dielectric layer 160 to be deposited with a planarized surface, as shown in FIG. 2, without the need for a subsequent planarizing process (e.g., CMP (chemical mechanical polishing)). In one embodiment of the invention, the organic photopatternable dielectric layer 160 is formed of spin-on polymer material, such as a photopatternable polyimide, a photopatternable epoxy, etc. The thickness of the organic photopatternable dielectric material is substantially greater than that of the MTJ (130/140/150).

Figure 3:
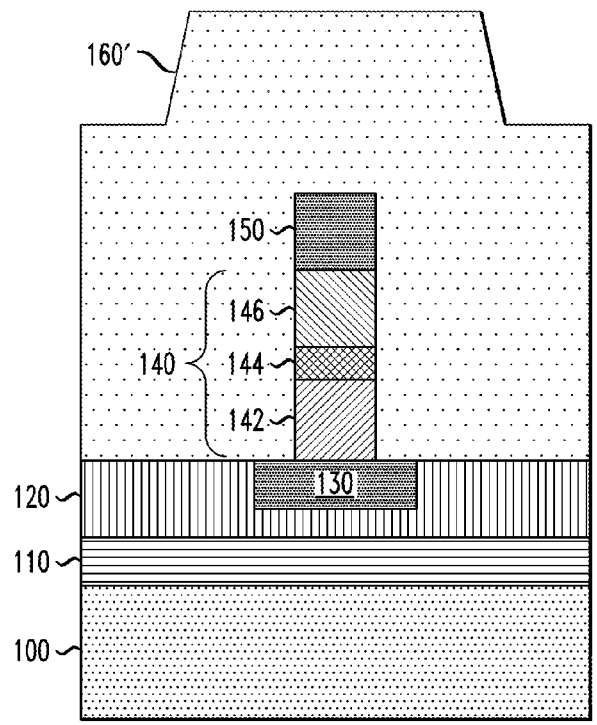
FIG. 3 is cross-sectional schematic view of the semiconductor device of FIG. 1 after depositing a layer of organic photopatternable dielectric material to encapsulate the MTJ structure, according to another embodiment of the invention.

In another embodiment of the invention, the organic photopatternable dielectric layer 160 can be formed by depositing an organic photopatternable dielectric material using a technique that results in a non-planarized surface, but wherein a planarizing process (e.g., CMP) can be subsequently performed to planarize the organic photopatternable dielectric layer 160. For example, FIG. 3 is cross-sectional schematic view of the semiconductor device of FIG. 1 after depositing an organic photopatternable dielectric layer 160' to encapsulate the MTJ structure (130/140/150), according to another embodiment of the invention, wherein the organic photopatternable dielectric layer 160' is not self planarizing. As shown in FIG. 3, while deposition of the organic photopatternable dielectric layer 160' results in a non-planar surface, the organic photopatternable dielectric layer 160' can be planarized using CMP to form the structure shown in FIG. 2. In one embodiment of the invention, the organic photopatternable dielectric layer 160' of FIG. 3 can be formed by depositing an organic photopatternable dielectric material (e.g., polymer material) using a low temperature CVD process (e.g., about 400 degrees Celsius and below).

Figure 4:
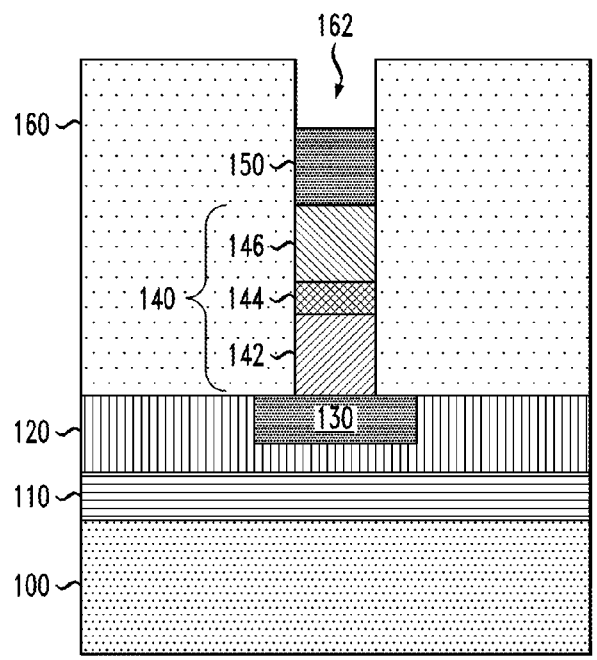
FIG. 4 is a cross-sectional schematic view of the semiconductor device of FIG. 2 after patterning the layer of organic photopatternable dielectric material to form a contact opening to the MTJ structure, according to an embodiment of the invention.

A next step in the fabrication process comprises patterning of the organic photopatternable dielectric layer 160 to form openings (e.g., trenches) down to the second (upper) electrodes of the MTJ structures. Any suitable patterning techniques can be used to form the desired openings shown in FIG. 4. These patterning techniques include the optical lithography patterning, e-beam lithography patterning, imprint lithography patterning, hot embossing patterning and the like. These direct patterning techniques eliminate or minimize the need for reactive ion etching step required the prior art practice where a photoresist (and an antireflective coating) is required to form the desired patterns and then followed by a reactive ion etching process. For example, FIG. 4 is a cross-sectional schematic view of the semiconductor device of FIG. 2 after patterning the organic photopatternable dielectric layer 160 to form a contact opening 162 to the second electrode 150 of the MTJ structure, according to an embodiment of the invention. The contact opening 162 is formed by photolithographically patterning the organic photopatternable dielectric layer 160. For example, the organic photopatternable dielectric layer 160 is exposed using a suitable exposure mask, developed (rinsed) to form the opening 162, and then annealed at a suitable temperature of about 400 degrees Celsius or less.

Figure 5:
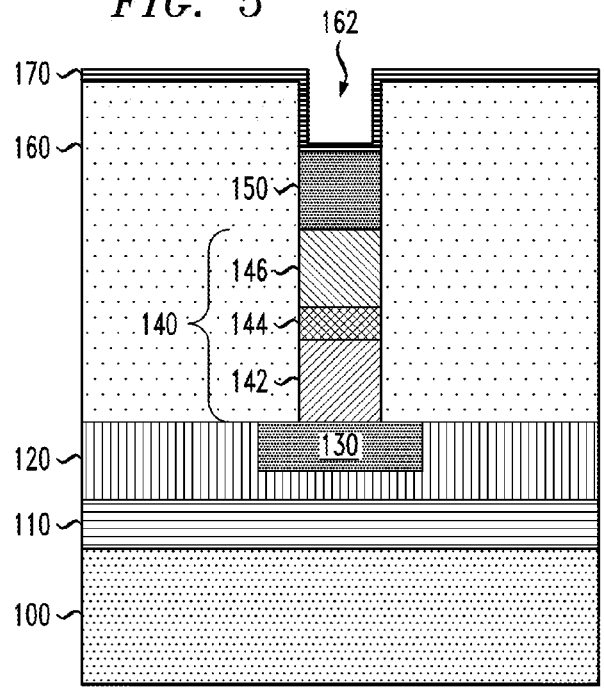
FIG. 5 is a cross-sectional schematic view of the semiconductor structure of FIG. 4 after forming a conformal liner over the surface of the semiconductor structure, according to an embodiment of the invention.
Figure 6:
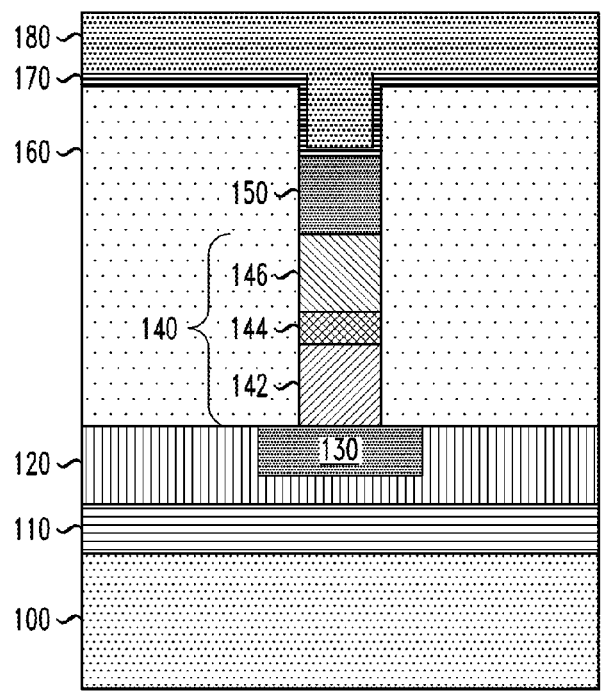
FIG. 6 is a cross-sectional schematic view of the semiconductor device of FIG. 5 after depositing a layer of metallic material to fill the contact opening, according to an embodiment of the invention.
Figure 7:
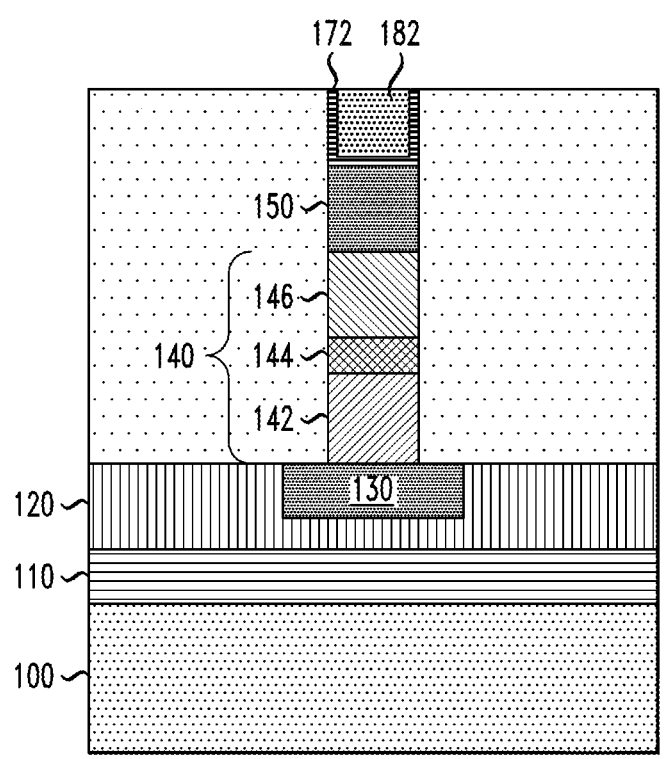
FIG. 7 is a cross-sectional schematic view of the semiconductor structure of FIG. 6 after planarizing the surface of the semiconductor structure down to the layer of organic photopatternable dielectric material, according to an embodiment of the invention.

After patterning the organic photopatternable dielectric layer 160, the contact openings formed in the organic photopatternable dielectric layer 160 are filled with metallic material to form BEOL interconnects (or horizontal wiring) to connect the MTJ structures to form the MRAM array. For example, FIGS. 5, 6, and 7 schematically illustrates a process flow to form metallic interconnects in the BEOL structure. In one embodiment, the metallic interconnects are formed using a standard copper damascene process.

In particular, FIG. 5 is a cross-sectional schematic view of the semiconductor structure of FIG. 4 after forming a conformal liner 170 over the surface of the semiconductor structure, according to an embodiment of the invention. In one embodiment, the conformal liner 170 comprises a plurality of conformal layers including, for example, a conformal diffusion barrier layer, and a copper seed layer. The conformal diffusion barrier layer is formed to conformally cover the surface of the organic photopatternable insulating layer 160 and the sidewall and bottom surfaces of the contact opening 162. The conformal diffusion barrier layer can be a thin layer of Ta or TaN material which is deposited using known methods. The conformal seed layer is formed over the conformal diffusion barrier layer using known techniques to provide a seed/adhesion layer (e.g., copper seed layer) for a subsequent metal deposition process.

FIG. 6 is a cross-sectional schematic view of the semiconductor device of FIG. 5 after depositing a layer of metallic material 180 over the surface of the organic photopatternable dielectric layer 160 to fill the contact opening 162 with metallic material, according to an embodiment of the invention. In one embodiment of the invention, the metallic material 180 comprises copper which is deposited on the copper seed layer using a standard electroplating process. After forming the layer of metallic material 180, a planarization process is performed to remove the excess metallic material from the surface of the patterned organic photopatternable dielectric layer 160.

FIG. 7 is a cross-sectional schematic view of the semiconductor structure of FIG. 6 after planarizing the surface of the semiconductor structure down to the organic photopatternable dielectric layer 160, according to an embodiment of the invention. In one embodiment of the invention, the planarization process is performed using CMP process with a chemical slurry having a composition that is configured to etchably remove both the metallic material 180 and the liner 170 highly selective (e.g., about 10:1 or greater) to the organic photopatternable dielectric layer 160. As shown in FIG. 7, following the CMP process, a portion 172 of the liner 170 and a portion 182 of the layer of metallic material 180 which remains in the contact opening 162 forms an electrical interconnect in the organic photopatternable dielectric layer 160.

It is to be understood that the width and height of the electrical interconnects will vary depending on, e.g., the design spacing rule of the given technology node utilized, the density of the MRAM devices, and other factors, which are known to those of ordinary skill in the art. Following the formation of the MRAM interconnects, any standard sequence of processing steps can be implemented to complete the fabrication of the BEOL structure to connect the active devices of the FEOL layer 110 and the MRAM devices in the BEOL structure, as well as form other elements of the target integrated circuit to be fabricated, the details of which are not needed to understand embodiments as discussed herein.

It is to be appreciated that the use of an organic photopatternable dielectric material to encapsulate an array of MTJ structures in a BEOL structure according to embodiments of the invention as described with reference to FIGS. 2, 3 and 4, for example, provides significant advantages and benefits over conventional schemes. For example, in a conventional process, the MTJ structure shown in FIG. 1 would be encapsulated in an ILD layer formed with SiN or SiOx, wherein the SiN or SiOx ILD material is patterned to form the openings to the MRAM devices. The conventional processes that are used to deposit the SiN or SiOx ILD material and pattern the SiN or SiOx ILD material to form metallic contacts are known to degrade the electrical/magnetic performance of the MTJ structures, and introduce depth variability of the trench openings, which further affects the MTJ properties.

More specifically, in a conventional process, the ILD layer would be formed of SiN using a CVD process in which the deposition temperatures, and curing temperatures for the SiN film are relatively high (e.g., greater than 400 degrees C.). Such high temperatures can damage the MTJ structures, resulting in degradation of the magnetic properties, as well as the electronic properties, of the MTJ structures. Moreover, the conventional process is more complex in that it requires a thermal anneal or UV cure of the ILD layer, followed by the deposition of (i) an adhesion layer, (ii) an ARC (anti-reflection coating) layer, and (iii) a photoresist layer, to form an etch mask that is used to etch openings in the ILD layer. With this process, the photoresist layer is patterned using standard methods, followed by a first etch process (e.g., RIE) to etch the exposed portion of the ARC layer, and then followed by a second etch process (e.g., RIE) to etch trenches in the ILD layer using the photoresist mask.

With this conventional process, the trenches that are etched are wider in profile than the width of the upper electrodes of the MTJ structures, which results in the etching of the ILD material adjacent to the sidewalls of the upper electrodes of the MTJ structures. This etch process introduces variability in the depth of the etched trenches, which results in more or less metallic material encapsulating the sides of the upper electrodes for different MTJ structures. This variability in trench depth, and consequently, the variability in the size of the electrical interconnects that contact the upper electrodes of the MTJ structures, results in variability in the characteristics of the MTJ structures across the MRAM array.

In contrast to conventional methods as discussed above, the use of organic photopatternable dielectric material to encapsulate the MTJ structures of MRAM devices provides significant advantages in terms of enhanced performance, higher yield, and reduced fabrication process complexity. Indeed, as compared to the conventional process (described above) which utilizes a conventional CVD dielectric film, embodiments of the invention as discussed above (e.g., FIGS. 2, 3 and 4) utilizes an organic photopatternable dielectric material (e.g., polymer) as ILD material to encapsulate the MTJ structures. Since the organic photopatternable dielectric material is deposited, exposed and cured at lower temperatures (as compared to conventional CVD process) the MTJ structures are subjected to minimal damage from thermal processing, and thus, performance degradation is minimized or eliminated. Furthermore, since the trenches are formed by directly photolithographically patterning the organic photopatternable dielectric material in one step, trench variability is minimized or otherwise eliminated, resulting in the fabrication of uniform contacts to the MTJ structures, which further improves both the performance and the yield of MRAM memories.

It is to be understood that the methods discussed herein can be incorporated in various semiconductor process flows to fabricate MRAM devices or other devices which comprise MTJ structures formed in a BEOL structure, in conjunction with integrated circuits having analog and digital circuitry or mixed-signal circuitry. In particular, integrated circuit dies can be fabricated with various devices such as FinFET devices, bipolar transistors, metal-oxide-semiconductor transistors, diodes, capacitors, inductors, etc. An integrated circuit can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques described herein according to embodiments of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:
1. A method, comprising:
   forming an MTJ (magnetic tunnel junction) structure on a semiconductor substrate;
   encapsulating the MTJ structure in a layer of organic photopatternable dielectric material;
   patterning the layer of organic photopatternable dielectric material to form a contact opening in the layer of organic photopatternable dielectric material to the MTJ structure, wherein patterning comprises exposing and developing the layer of organic photopatternable dielectric material to form the contact opening; and
   filling the contact opening in the layer of organic photopatternable dielectric material with metallic material to form a conductive contact to the MTJ structure;
   wherein the MTJ structure is formed as part of a BEOL (back end of line) structure formed on the semiconductor substrate, and wherein the layer of organic photopatternable dielectric material serves as an ILD (inter-level dielectric) layer of the BEOL structure.

2. The method of claim 1, wherein encapsulating the MTJ structure in a layer of organic photopatternable dielectric material comprises spin-on depositing the organic photopatternable dielectric material on the semiconductor substrate to form a self-planarized layer of organic photopatternable dielectric material.

3. The method of claim 1, wherein the organic photopatternable dielectric material comprises a photopatternable polymer material.

4. The method of claim 3, wherein the polymer material comprises at least one of a photopatternable polyimide and a photopatternable epoxy.

5. The method of claim 1, wherein patterning the layer of organic photopatternable dielectric material to form a contact opening comprises forming a trench in the layer of organic photopatternable dielectric material, wherein the trench has a width that is substantially the same as a width of an electrode of the MTJ structure.

6. The method of claim 1, wherein the MTJ structure comprises a MRAM (magnetic random access memory) element.

7. A method, comprising:
   forming an MTJ (magnetic tunnel junction) structure on a semiconductor substrate;
   encapsulating the MTJ structure in a layer of organic photopatternable dielectric material;
   patterning the layer of organic photopatternable dielectric material to form a contact opening in the layer of organic photopatternable dielectric material to the MTJ structure; and
   filling the contact opening with metallic material;
   wherein encapsulating the MTJ structure in a layer of organic photopatternable dielectric material comprises:
      depositing the organic photopatternable dielectric material on the semiconductor substrate; and
      planarizing the layer of organic photopatternable dielectric material.

8. A semiconductor structure formed by a process comprising:
   forming an MTJ (magnetic tunnel junction) structure on a semiconductor substrate;
      encapsulating the MTJ structure in a layer of organic photopatternable dielectric material;
      patterning the layer of organic photopatternable dielectric material to form a contact opening in the layer of organic photopatternable dielectric material to the MTJ structure, wherein patterning comprises exposing and developing the layer of organic photopatternable dielectric material to form the contact opening; and
      filling the contact opening in the layer of organic photopatternable dielectric material with metallic material to form a conductive contact to the MTJ structure;
      wherein the MTJ structure is formed as part of a BEOL (back end of line) structure formed on the semiconductor substrate, and wherein the layer of organic photopatternable dielectric material serves as an ILD (inter-level dielectric) layer of the BEOL structure.

9. The semiconductor structure of claim 8, wherein encapsulating the MTJ structure in a layer of organic photopatternable dielectric material comprises spin-on depositing the organic photopatternable dielectric material on the semiconductor substrate to form a self-planarized layer of organic photopatternable dielectric material.

10. The semiconductor structure of claim 8, wherein encapsulating the MTJ structure in a layer of organic photopatternable dielectric material comprises:
   depositing the organic photopatternable dielectric material on the semiconductor substrate; and
   planarizing the layer of organic photopatternable dielectric material.

11. The semiconductor structure of claim 8, wherein the organic photopatternable dielectric material comprises a photopatternable polymer material.

12. The semiconductor structure of claim 11, wherein the polymer material comprises at least one of a photopatternable polyimide and a photopatternable epoxy.

13. The semiconductor structure of claim 8, wherein patterning the layer of organic photopatternable dielectric material to form a contact opening comprises forming a trench in the layer of organic photopatternable dielectric material, wherein the trench has a width that is substantially the same as a width of an electrode of the MTJ structure.

14. The semiconductor structure of claim 8, wherein the MTJ structure comprises a MRAM (magnetic random access memory) element.

\* \* \* \* \*